(12) United States Patent
Oh

(10) Patent No.: US 8,533,535 B2
(45) Date of Patent: Sep. 10, 2013

(54) SEMICONDUCTOR MEMORY DEVICE

(75) Inventor: Tae-youg Oh, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 384 days.

(21) Appl. No.: 13/005,156

(22) Filed: Jan. 12, 2011

(65) Prior Publication Data

US 2011/0191640 A1    Aug. 4, 2011

(30) Foreign Application Priority Data

Jan. 29, 2010   (KR) .................... 10-2010-0008598

(51) Int. Cl.
*G06F 11/00*    (2006.01)

(52) U.S. Cl.
USPC .......................................................... 714/42

(58) Field of Classification Search
USPC .......................................................... 714/42
See application file for complete search history.

(56) References Cited

U.S. PATENT DOCUMENTS

| 7,702,862 | B2* | 4/2010 | Syed et al. | 711/154 |
| 7,865,784 | B1* | 1/2011 | White et al. | 714/53 |
| 7,877,668 | B2* | 1/2011 | Sugahara | 714/764 |
| 8,307,270 | B2* | 11/2012 | Kim et al. | 714/805 |
| 2002/0056063 | A1* | 5/2002 | Nerl | 714/733 |
| 2005/0223300 | A1* | 10/2005 | Baartmans et al. | 714/48 |
| 2007/0136623 | A1* | 6/2007 | Perego et al. | 714/704 |
| 2008/0294949 | A1* | 11/2008 | Sugahara | 714/718 |
| 2010/0332951 | A1* | 12/2010 | Peng et al. | 714/773 |
| 2011/0289368 | A1* | 11/2011 | Daga et al. | 714/711 |

* cited by examiner

*Primary Examiner* — Bryce Bonzo
(74) *Attorney, Agent, or Firm* — F. Chau & Associates, LLC

(57) ABSTRACT

A memory device and a method of controlling the memory device are provided, comprising: generating commands at a memory controller; counting a number of commands in response to a clock signal; storing the commands and the count numbers corresponding to the commands; transmitting to a memory device the commands, the count number of the commands, and data; receiving at the memory device the commands, the count number of the commands, and data sent from the memory controller; counting at the memory device the number of commands received in response to the clock signal; storing at the memory device the count number of commands received; and transmitting the count number of the commands received to the memory controller, wherein said transmitting the count number of the command to the memory controller is performed upon indication of an error condition.

20 Claims, 17 Drawing Sheets

SEMICONDUCTOR MEMORY DEVICE

This application claims the benefit of Korean Patent Application No. 10-2010-0008598, filed on Jan. 29, 2010, in the Korean Intellectual Property Office, the disclosure of which is incorporated by reference herein in its entirety.

BACKGROUND

The inventive concept relates to a semiconductor memory system, and more particularly, to a semiconductor memory system in which an error in data communication between a semiconductor memory device and a memory controller is simply detected.

As semiconductor memory devices increase in density and the speed of operating memory interfaces increases, the communication channel between a memory device and a memory controller is subject to increased channel noise, and the occurrence of errors in the transmission and reception of memory data, addresses, and commands is increased. When an error occurs in such data communication, the data, address, or command signals involved in the memory operation may have to be retransmitted, and processing and operational speed of the system can degrade significantly.

SUMMARY

A memory system is provided, comprising: a memory controller comprising: a command generator configured to generate commands; a first counter configured to count a first number of commands in response to a clock signal; a first register configured to store the first number of commands counted; a first interface configured to interface with a memory device including transmitting the commands, the first number of commands counted, address, and transmitting and receiving bytes of data; the memory device comprising: a second interface configured to interface with the memory controller including receiving the commands, the first number of commands counted, the address, and the data from the memory controller; a second counter configured to count a second number of commands received in response to the clock signal; a second register configured to store the second number of commands received, wherein the second interface is further configured to transmit the second number of commands received to the memory controller.

The memory system further including an error detector configured to detect an occurrence of error in the commands, the address or the data received from the memory controller and to output an error detect signal, wherein the count number of the commands received stored in the second register is sent to the memory controller based on the error detect signal.

The memory system further including a common clock generator configured to generate the clock signal, wherein the common clock generator is disposed in the memory controller or in the memory device, or is disposed external to the memory controller and the memory device.

According to one of the embodiments, the first counter and the second counter are configured to reset using a common reset signal. According to another embodiment, the common reset signal is based on a refresh command.

According to one of the embodiments, the memory controller is configured to store commands corresponding to the number of commands counted in the first register.

According to one of the embodiments, the memory device includes a DRAM.

According to at least one of the embodiments, a memory device is provided, comprising:

an interface configured to interface with a memory controller including receiving commands, data, and address from the memory controller; a counter configured to count a number of commands received in response to a clock signal; and a register configured to store the count number of commands received, wherein the interface is further configured to transmit the count number of the commands received to the memory controller, wherein the clock signal is commonly used in the memory device and the memory controller to clock the commands.

The memory device further including an error detector configured to detect an occurrence of error in the commands, the address or the data received from the memory controller and to output an error detect signal, wherein the count number of the commands received stored in the register is sent to the memory controller based on the error detect signal.

According to another embodiment, a memory device is provided, comprising: an interface configured to interface with a memory controller including receiving commands, data, and address from the memory controller; a counter configured to count a number of pulses of a clock signal; and a register configured to store the count number of pulses of the clock signal, wherein the interface is further configured to transmit the count number of the number of pulses of the clock signal to the memory controller.

The memory device further including a clock signal line carrying the clock signal is connected to the memory controller.

A memory system is also provided, comprising: a memory controller comprising: a command generator configured to generate commands; a first counter configured to count a number of commands in response to a clock signal; a first register configured to store the number of commands counted; a first interface configured to interface with a hub to transmit the commands, the count number, and to transmit and receive data; and a plurality of memory devices connected to the hub, each memory device comprising: a second interface configured to interface with the hub including receiving the commands, the count number, and the bytes of data from the memory controller; a second counter configured to count a number of commands received in response to the clock signal; a second register configured to store the count number of commands received, wherein the second interface is further configured to transmit the count number of the commands received to the memory controller via the hub.

A method of memory control is provided, comprising: generating commands at a memory controller; counting a number of commands in response to a clock signal; storing the commands and the count numbers corresponding to the commands;
transmitting to a memory device the commands, the count number of the commands, and data;
receiving at the memory device the commands, the count number of the commands, and data sent from the memory controller; counting at the memory device the number of commands received in response to the clock signal; storing at the memory device the count number of commands received; and transmitting the count number of the commands received to the memory controller, wherein said transmitting the count number of the command to the memory controller is performed upon indication of an error condition; and retransmitting from the memory controller to the memory device the command and data corresponding to the count number of the commands received from the memory device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments.

Figure 1:
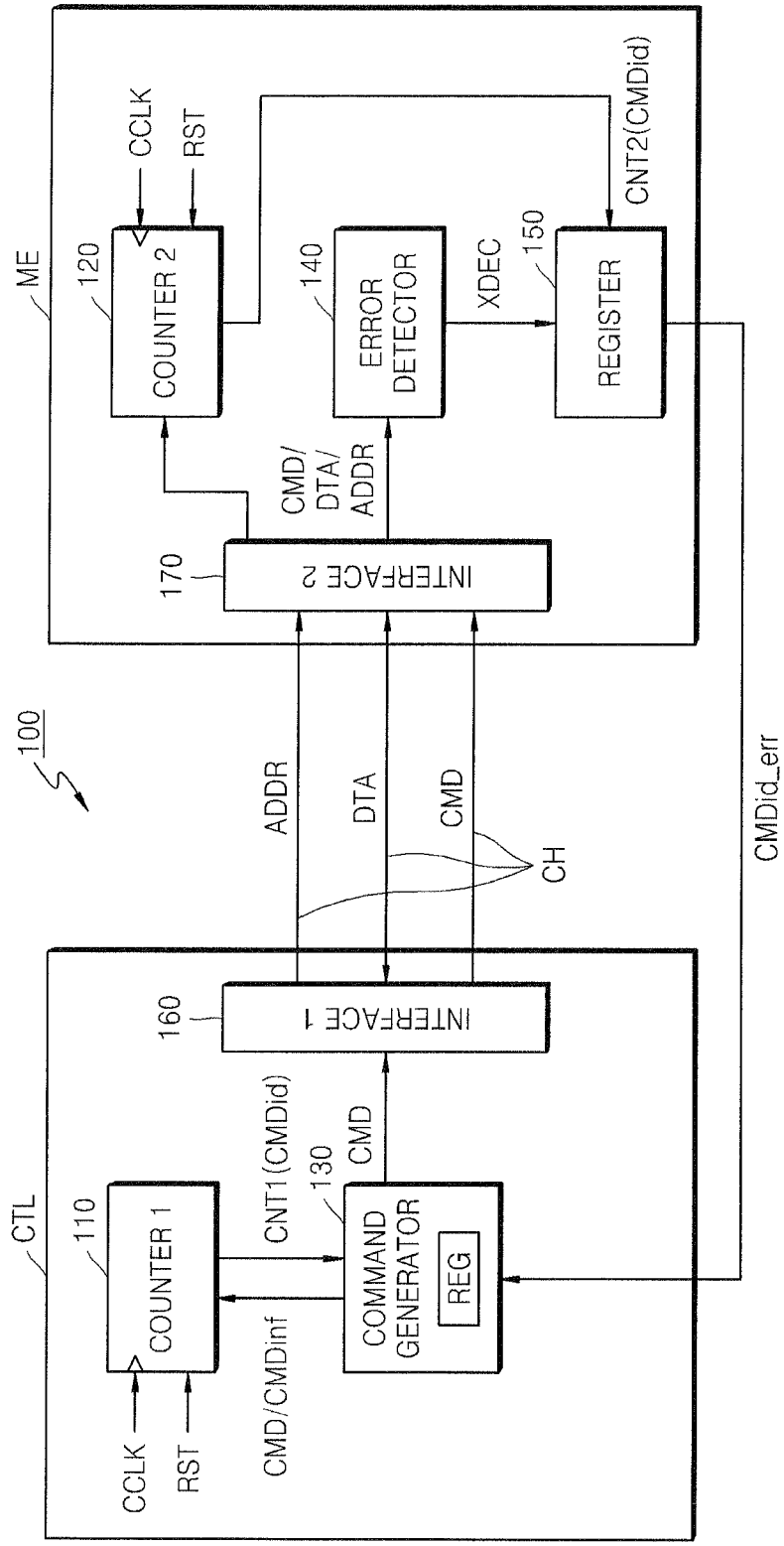
FIG. 1 illustrates a semiconductor memory system according to an embodiment of the inventive concept.

FIG. 1 illustrates a semiconductor memory system 100 according to an embodiment of the inventive concept.

Referring to FIG. 1, the semiconductor memory system 100 according to the current embodiment of the inventive concept includes a semiconductor memory device ME and a memory controller CTL. The semiconductor memory device ME may be a dynamic random access memory (DRAM), which may be a graphic DRAM, such as a graphics double data rate (GDDR) type DRAM. Alternatively, the semiconductor memory device ME may be a nonvolatile memory, such as a resistive RAM (RRAM), a phase-change RAM (PRAM), a ferroelectric RAM (FRAM), or the like.

The memory controller CTL includes a command generator 130 that generates a command CMD applied to the semiconductor memory device ME. The command CMD applied to the semiconductor memory device ME from the memory controller CTL may be a command for performing an operation of writing data DTA in the semiconductor memory device ME or reading the data DTA from the semiconductor memory device ME. For example, when the semiconductor memory device ME is a DRAM or a GDDR type DRAM, the command CMD may be active, write, read, precharge, auto refresh, or the like, in accordance with the Joint Electron Device Engineering Council (JEDEC) standard on a double data rate (DDR) or a GDDR type DRAM.

The memory controller CTL applies the data DTA and an address ADDR as well as the command CMD to the semiconductor memory device ME to read and write data into and out of the memory device ME.

The memory controller CTL may include an input/output interface 160 that transmits the command CMD, the data DTA, and the address ADDR to the semiconductor memory device ME through a transmission channel CH. The input/output interface 160 may be a pad or a pin.

The memory controller CTL may transmit an error detection code (EDC) together with the command CMD, the data DTA or the address ADDR to the semiconductor memory device ME in such a way that an error occurring when the command CMD, the data DTA or the address ADDR is transmitted to the semiconductor memory device ME is able to be detected by the semiconductor memory device ME.

The memory controller CTL further includes a counter 110. The counter 110 of the memory controller CTL operates in response to a common clock signal CCLK. In embodiments where the semiconductor memory device ME is a graphic DRAM, the common clock signal CCLK of FIG. 1 may be a common clock signal.

The counter 110 of the memory controller CTL may count the number of pulses of the common clock signal CCLK. Alternatively, the counter 110 of the memory controller CTL may count the number of commands CMD that are generated by the command generator 130 and applied to the semiconductor memory device ME.

Before counting, the counter 110 of the memory controller CTL may be reset in response to a reset signal RST. The reset signal RST may be used to reset the counter 110 of the memory controller CTL when the semiconductor memory device ME is reset or when a predetermined command, such as a refresh command, is applied to the semiconductor memory device ME, as will be described later.

A counted value CNT1 counted by the counter 110 of the memory controller CTL is set as a command identifier CMDid regarding the command CMD applied to the semiconductor memory device ME. The counter 110 of the memory controller CTL may transmit the counted value CNT1 regarding the command CMD to the command generator 130 by receiving the command CMD or information CMDinf regarding the command CMD transmitted from the command generator 130.

The command generator 130 may set the counted value CNT1 transmitted from the counter 110 of the memory controller CTL as the command identifier CMDid and may store the command identifier CMDid in a register in the command generator 130. However, aspects of the inventive concept are not limited thereto, and the register may be disposed detachably from the command generator 130 or may be a nonvolatile memory. The register may store a command corresponding to the command identifier CMDid and data and an address related to the corresponding command. In the event an error is detected, data and/or commands stored in the register can be retransmitted to the memory device ME.

Referring to FIG. 1, the semiconductor memory device ME receives the command CMD, the data DTA, and the address ADDR from the memory controller CTL via the input/output interface 170.

The semiconductor memory device ME may include an error detector 140 that checks the error code EDC sent from the memory controller CTL pursuant to a preset algorithm to determine whether an error is present in the received command CMD, data DTA or address ADDR. An operation of the error detector 140 will be described later.

When an error is present in the command CMD, the data DTA or the address ADDR, the error detector 140 generates an error detection signal XDEC. The command identifier storage unit 150 outputs a command identifier CMDid_err regarding the command CMD in which an error is detected or the data DTA or address ADDR in which an error is detected, in response to the error detection signal XDEC. The command identifier storage unit 150 of the semiconductor memory device ME of FIG. 1 may be a register. However, aspects of the inventive concept are not limited thereto, and the command identifier storage unit 150 may be a nonvolatile memory.

A counter 120 of the semiconductor memory device ME operates in response to the common clock signal CCLK to count the number of clock pulses CNT2. The command identifier storage unit 150 of the semiconductor memory device ME receives the counted value CNT2 transmitted from a counter 120 of the semiconductor memory device ME, and may store the counted value as the command identifier CMDid.

The common clock signal CCLK applied to the counter 120 of the semiconductor memory device ME is synchronized with the common clock signal CCLK applied to the counter 110 of the memory controller CTL. In other words, the counter 110 of the memory controller CTL and the counter 120 of the semiconductor memory device ME are synchronized with each other by the common clock signal CCLK.

The counter 120 of the semiconductor memory device ME receives the reset signal RST and thus it is reset when the counter 110 of the memory controller CTL is reset. According to another embodiment of the present inventive concept, the counter 120 may count the number of received commands CMD, consistent with the embodiment wherein the counter of the memory controller CTL counts the number of commands CMD applied to the semiconductor memory device ME. Thus, latency issues with respect to a command being transmitted to the semiconductor memory ME from the memory controller CTL are eliminated.

Accordingly, the counter 120 of the semiconductor memory device ME and the counter 110 of the memory controller CTL of the semiconductor memory system 100 of FIG. 1 may be synchronized with each other by the common clock signal CCLK. The command identifier CMDid generated at the counter 110 and the counter 120 should match when the DATA, ADDR, or CMD signals are received at the semiconductor memory device ME without error.

When an error is detected by error detector 140, the command identifier storage unit 150 outputs a command identifier CMDid_error to the memory controller CTL. As shown in FIG. 1, the command identifier CMDid_err signal may be transmitted to the memory controller CTL without passing through the input/output interface 170 of the semiconductor memory device ME or an input/output interface 160 of the memory controller CTL. Alternatively, the command identifier CMDid_err is output from the semiconductor memory device ME through an input/output interface 170, such as a DQ pin or DQ pad, that will be described later.

Thus, in the semiconductor memory system 100 of FIG. 1, the counted values of either clock pulses or number of commands CNT1 and CNT2 of the counters 110 and 120 that are respectively disposed in the semiconductor memory device ME and the memory controller CTL are used as command identifiers. When an error occurs with the transmission or reception of data DTA, the address ADDR or the command CMD, the command identifiers can be read and the signals including data DTA, the address ADDR or the command CMD corresponding to the command identifiers can be retrieved and retransmitted. Also, in the semiconductor memory system 100 of FIG. 1, even when the memory controller CTL transmits the command CMD to the semiconductor memory device ME and does not transmit the command identifier CMDid to the semiconductor memory device ME, the semiconductor memory device ME is able to recognize the command identifier CMDid. With the signals corresponding to an erroneous communication identified and stored in a register, either in the command generator 130 of the memory controller CTL or in the register 150 of the memory device ME, an error correction operation that typically involves retransmission of a large number of signals can be reduced and limited to those signals stored in the register.

Figure 2:
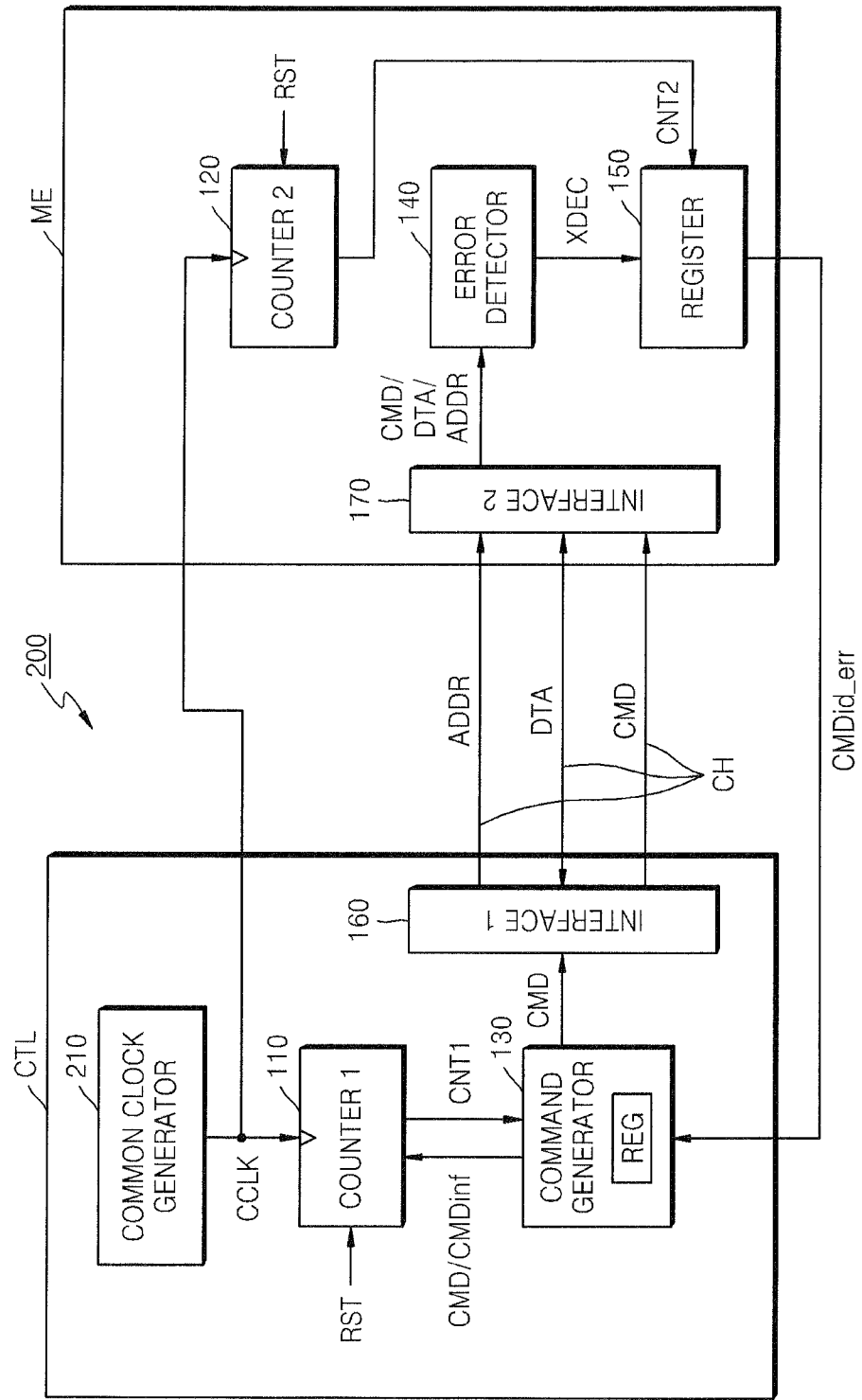
FIG. 2 illustrates generating a common clock signal in the semiconductor memory system illustrated in FIG. 1, according to an embodiment of the inventive concept.

FIG. 2 illustrates generating a common clock signal CCLK in the semiconductor memory system 100 illustrated in FIG. 1, according to an embodiment of the inventive concept.

Referring to FIG. 2, in a semiconductor memory system 200 according to the current embodiment of the inventive concept, the common clock signal CCLK is generated by a common clock generator 210 disposed in the memory controller CTL. The common clock signal CCLK generated by the common clock generator 210 of the memory controller CTL is applied to the counter 110 of the memory controller CTL and the counter 120 of the semiconductor memory device ME.

FIG. 2 illustrates that the common clock signal CCLK applied to the counter 120 of the semiconductor memory device ME from the common clock generator 210 of the memory controller CTL is transmitted to the semiconductor memory device ME without passing through the input/output interface 170 of the semiconductor memory device ME and the input/output interface 160 of the memory controller CTL. Alternatively, the common clock signal CCLK can be applied to the semiconductor memory device ME through the input/output interface 160 of the memory controller CTL, such as a clock pin (not shown), and received at and the input/output interface 170 of the semiconductor memory device ME.

Figure 3:
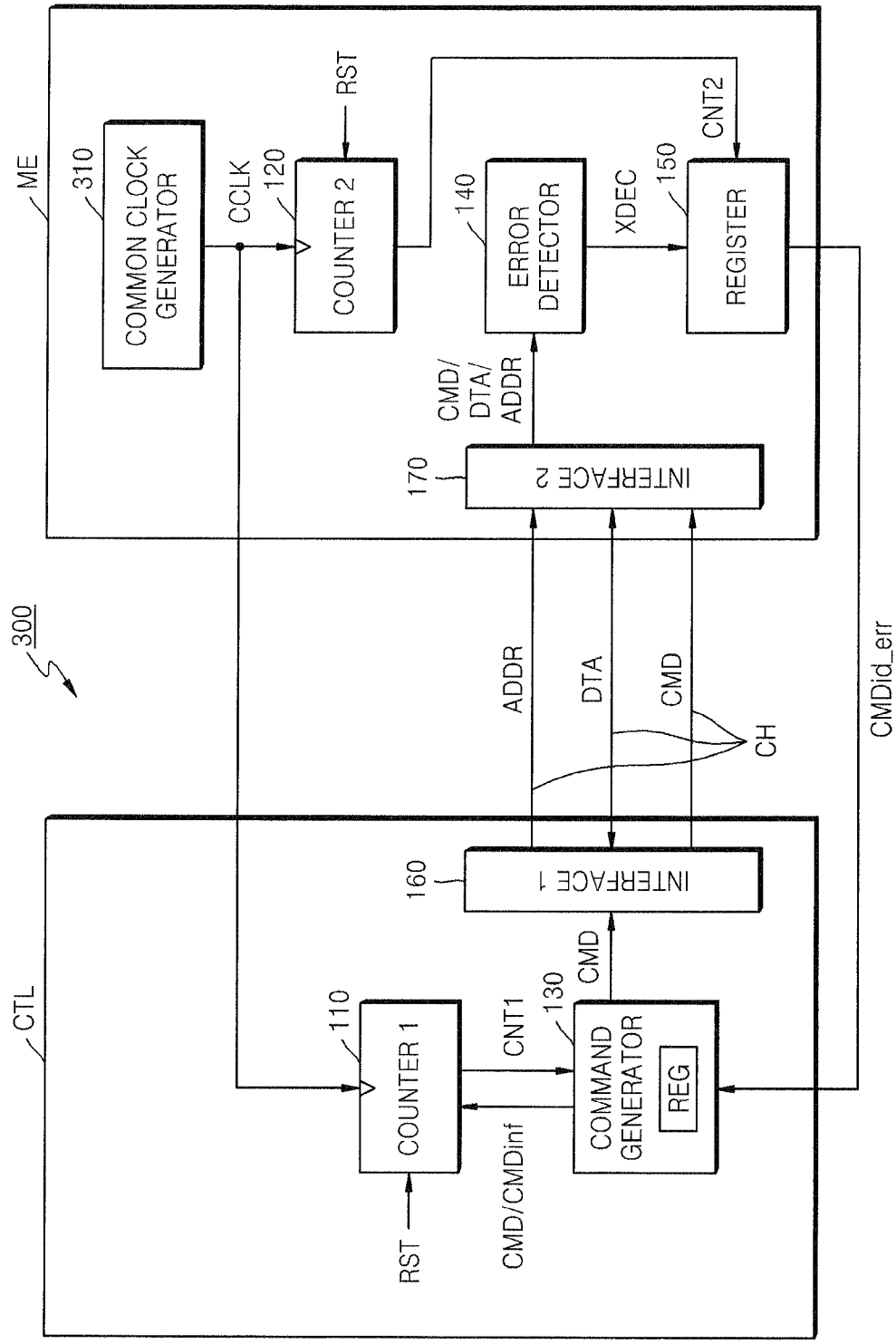
FIG. 3 illustrates generating a common clock signal in the semiconductor memory system illustrated in FIG. 1, according to another embodiment of the inventive concept.

FIG. 3 illustrates generating a common clock signal CCLK in the semiconductor memory system 100 illustrated in FIG. 1, according to another embodiment of the inventive concept.

Referring to FIG. 3, in a semiconductor memory system 300 according to the current embodiment of the inventive concept, the common clock signal CCLK may be generated by a common clock generator 310 disposed in the semiconductor memory device ME. The common clock signal CCLK generated by the common clock generator 310 of the semiconductor memory device ME is applied to the counter 110 of the memory controller CTL and the counter 120 of the semiconductor memory device ME.

Figure 4:
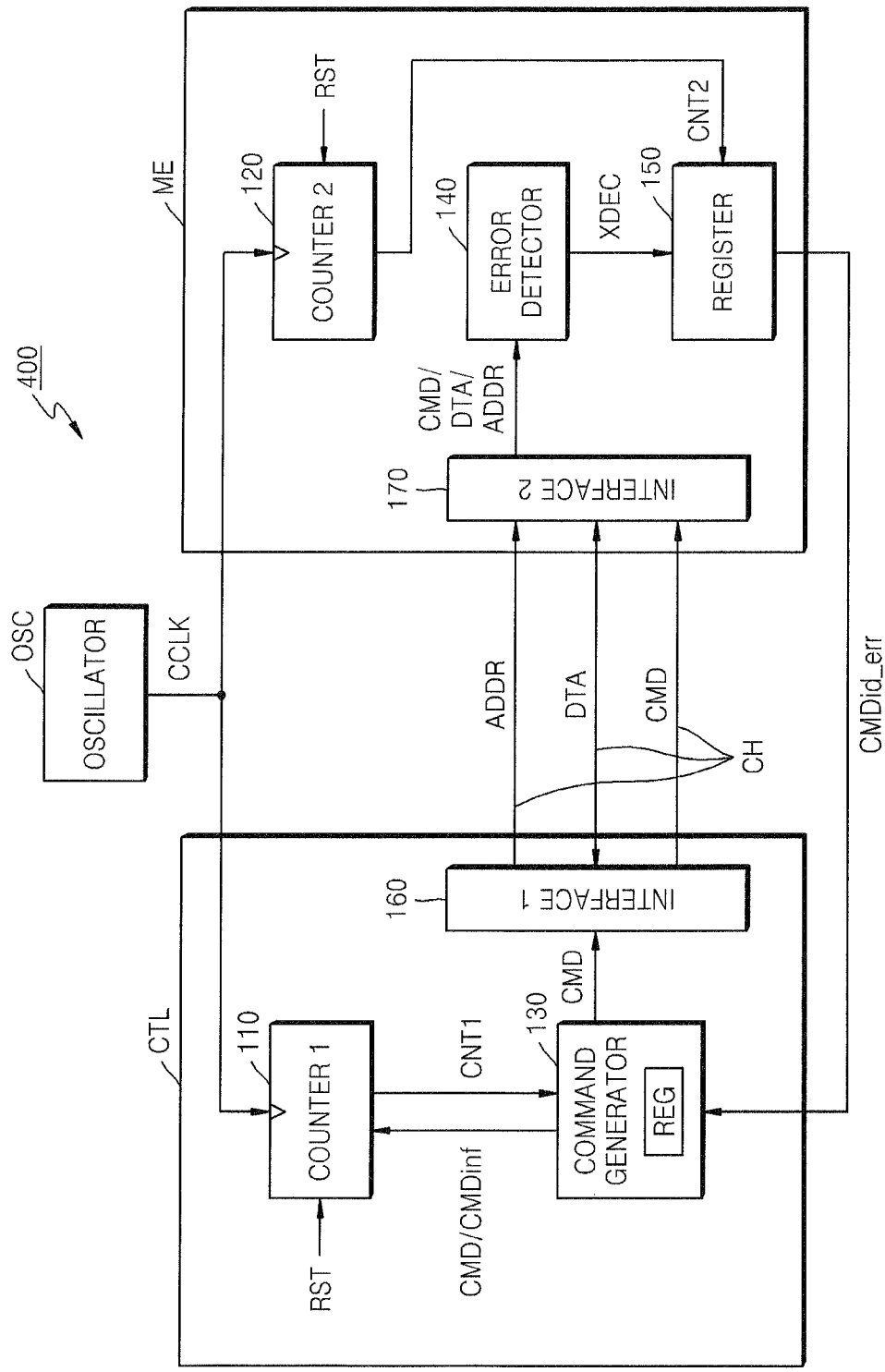
FIG. 4 illustrates generating a common clock signal in the semiconductor memory system illustrated in FIG. 1, according to another embodiment of the inventive concept.

FIG. 4 illustrates generating a common clock signal CCLK in the semiconductor memory system 100 illustrated in FIG. 1, according to another embodiment of the inventive concept.

Referring to FIG. 4, in a semiconductor memory system 400 according to the current embodiment of the inventive concept, the common clock signal CCLK may be generated by an oscillator OSC disposed outside the semiconductor memory device ME and the memory controller CTL and mounted on a board included in the semiconductor memory system 100. The common clock signal CCLK generated by the oscillator OSC is applied to the counter 110 of the memory controller CTL and the counter 120 of the semiconductor memory device ME.

Thus, the semiconductor memory system 100 of FIG. 1 may generate the common clock signal CCLK in the different ways shown in FIGS. 2 to 4, and in each embodiment, the common clock CCLK that feeds both the counter 110 and counter 120 can be the same clock or different clocks that remain synchronize with one another.

Figure 5:
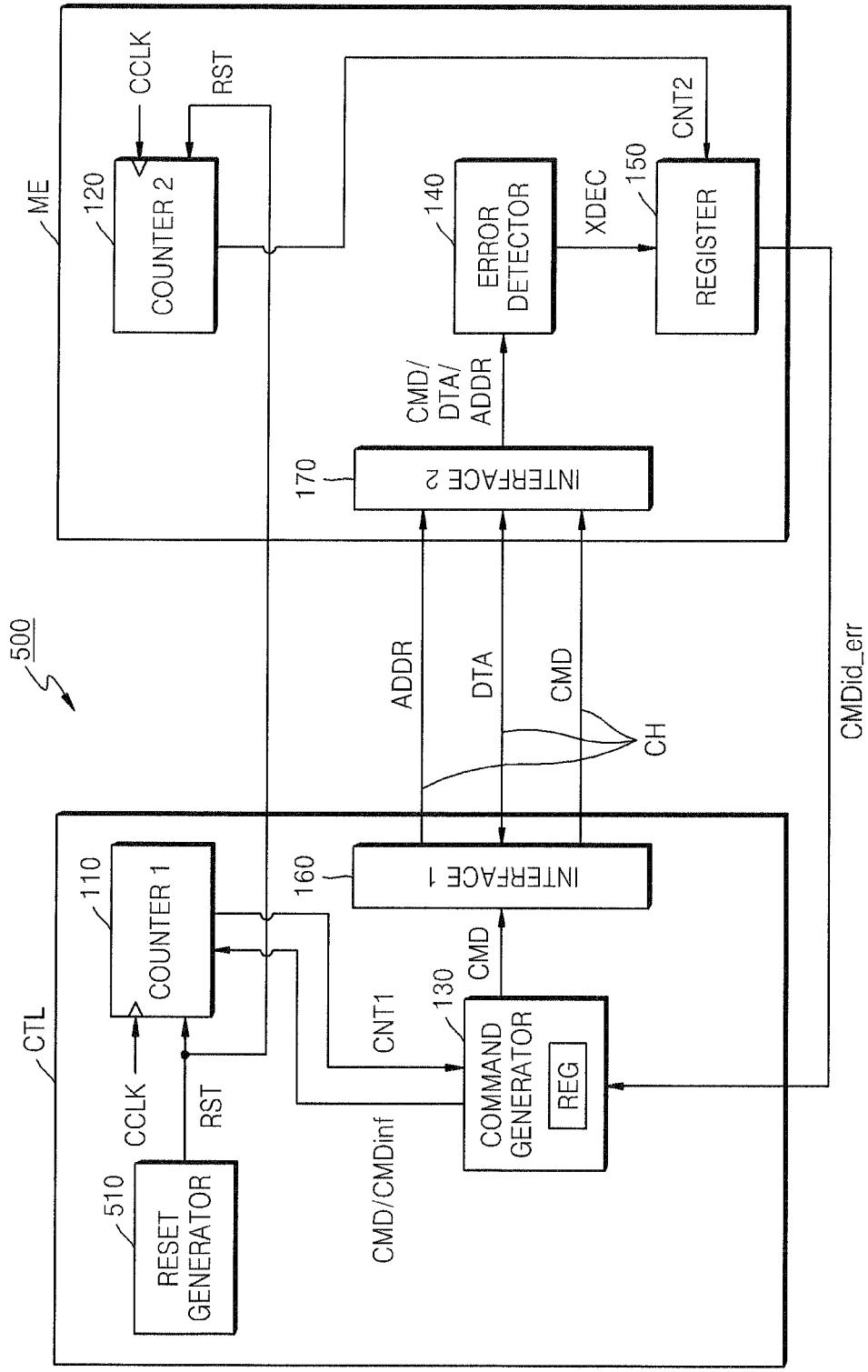
FIG. 5 illustrates generating a reset signal in the semiconductor memory system illustrated in FIG. 1, according to an embodiment of the inventive concept.

FIG. 5 illustrates generating a reset signal in the semiconductor memory system 100 illustrated in FIG. 1, according to an embodiment of the inventive concept.

Referring to FIG. 5, in a semiconductor memory system 500 according to the current embodiment of the inventive concept, the counter 120 of the semiconductor memory device ME and the counter 110 of the memory controller CTL are reset by a common reset signal RST. The signal RST may also be connected to a reset signal that reset the semiconductor memory device ME. Thus, when the semiconductor memory device ME is reset, the counter 120 of the semiconductor memory device ME and the counter 110 of the memory controller CTL are also reset.

The memory controller CTL may further include a reset signal generator 510 that generates the reset signal RST when the semiconductor memory device ME is reset and applies the reset signal RST to the counter 120 of the semiconductor memory device ME and the counter 110 of the memory controller CTL. In such embodiment, the reset signal generator 510 generates the reset signal RST under control of the memory controller CTL.

Figure 6:
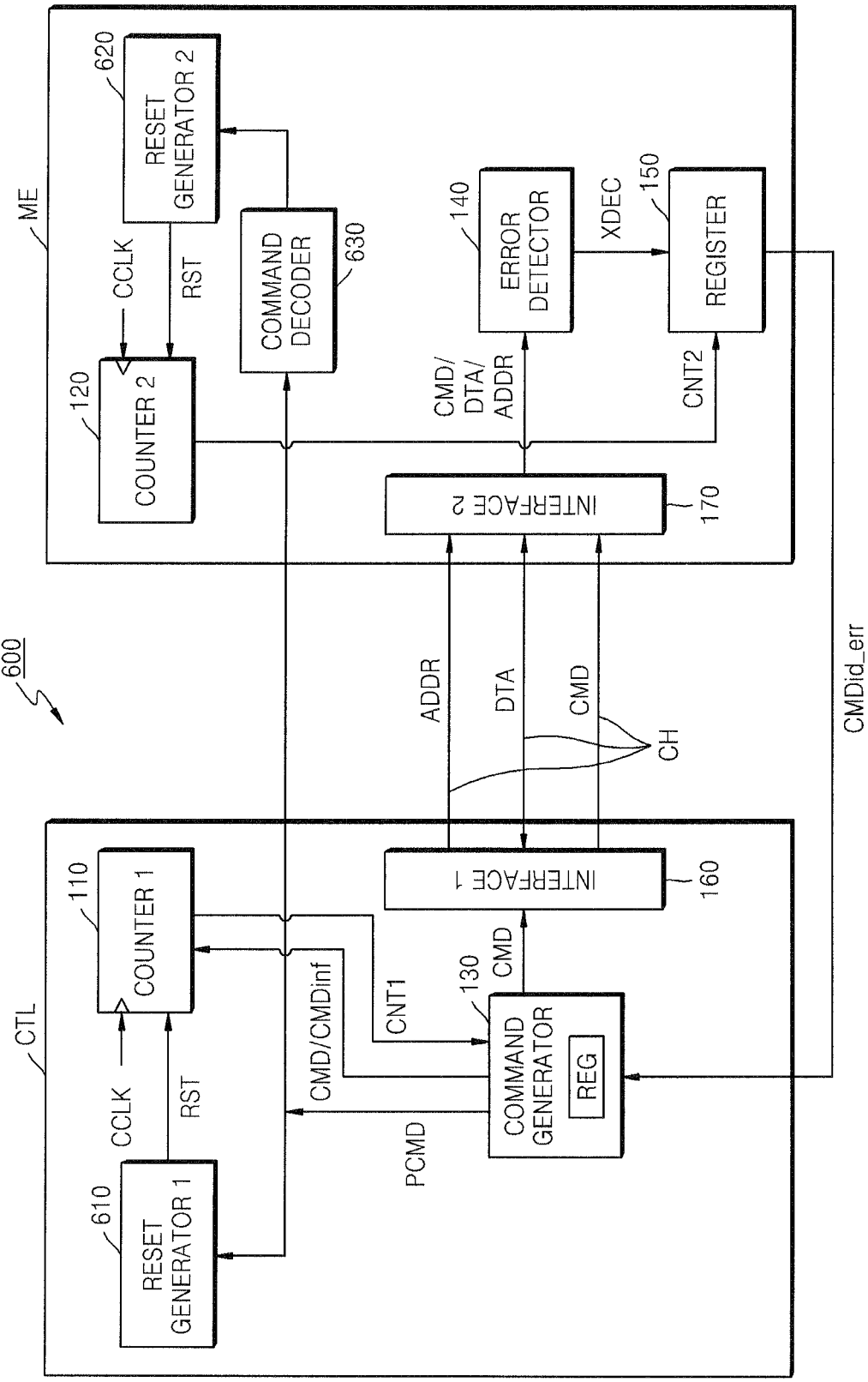
FIG. 6 illustrates generating a reset signal in the semiconductor memory system illustrated in FIG. 1, according to another embodiment of the inventive concept.

FIG. 6 illustrates generating a reset signal in the semiconductor memory system 100 illustrated in FIG. 1, according to another embodiment of the inventive concept.

Referring to FIG. 6, in a semiconductor memory system 600 according to the current embodiment of the inventive concept, when a predetermined command PCMD is applied to the semiconductor memory device ME, the counter 120 of the semiconductor memory device ME and the counter 110 of the memory controller CTL may be reset. The predetermined command PCMD may be user programmable. For example, when the semiconductor memory device ME is a GDDR type DRAM, the predetermined command PCMD may be the same command as a refresh command "REF".

The memory controller CTL may further include a reset signal generator 610 that generates the reset signal RST when the predetermined command PCMD is applied to reset the counter 110 of the memory controller CTL. Also, the semiconductor memory device ME may further include a reset signal generator 620 that generates the reset signal RST when the semiconductor memory device ME receives the predetermined command PCMD and applies the reset signal RST to the counter 120 of the semiconductor memory device ME. The reset signal generator 620 may receive the predetermined command PCMD from a command decoder 630 of the semiconductor memory device ME. The predetermined command PCMD may be directly transmitted to the command decoder 630 of the semiconductor memory device ME from the command generator 130 of the memory controller CTL. According to another embodiment, the predetermined command PCMD may be transmitted to the command decoder 630 via the input/output interface 170 of the semiconductor memory device ME (not shown).

Figure 7:
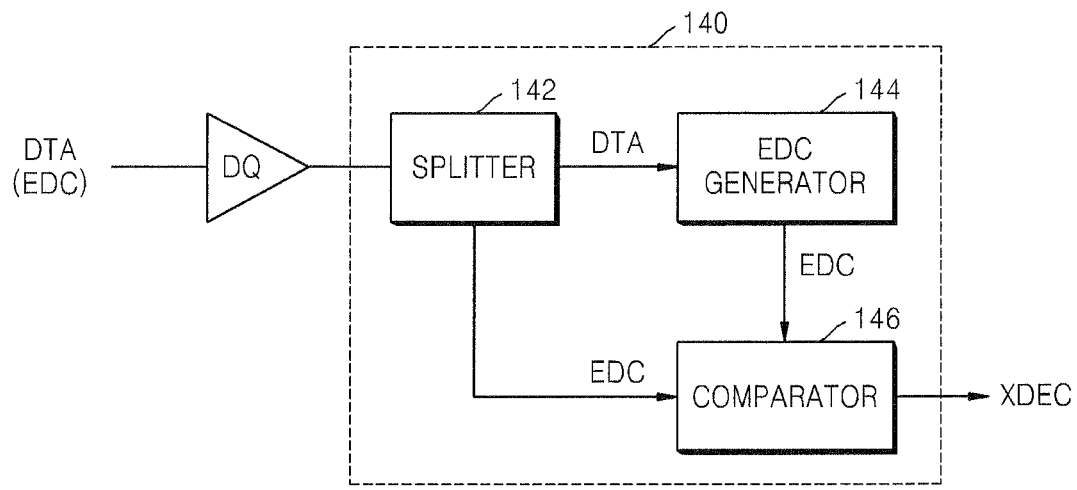
FIG. 7 illustrates a block diagram of an error detector according to an embodiment of the inventive concept.

FIG. 7 illustrates a block diagram of the error detector 140 of the semiconductor memory system 100 of FIG. 1.

Referring to FIGS. 1 and 7, the error detector 140 includes a splitter 142, an error EDC generator 144, and a comparator 146.

An error detection code EDC may be included in the data DTA received via an input/output interface, such as a DQ pin or DQ pad, of the semiconductor memory device ME. The splitter 142 splits the data DTA into data DTA and an EDC. The EDC generator 144 receives the data DTA from the splitter 142 and generates a new error detection code EDC' based on the received data DTA. The comparator 146 receives the EDC from the splitter 142 and compares the received error detection code EDC with the new error detection code EDC' generated by the EDC generator 144.

According to this embodiment, an error is detected when the error detection codes EDC and EDC' are different from each other. In such instance, the comparator 146 outputs the error detection signal XDEC to signal an error in the transmission or reception of the current data packet.

Although FIG. 7 illustrates the error detector 140 that performs error detection on the data DTA, it is readily apparent to one ordinary skilled in the art that the same error detection method can be applicable using the commands CMD or addresses ADDR to perform error detection.

Figure 8:
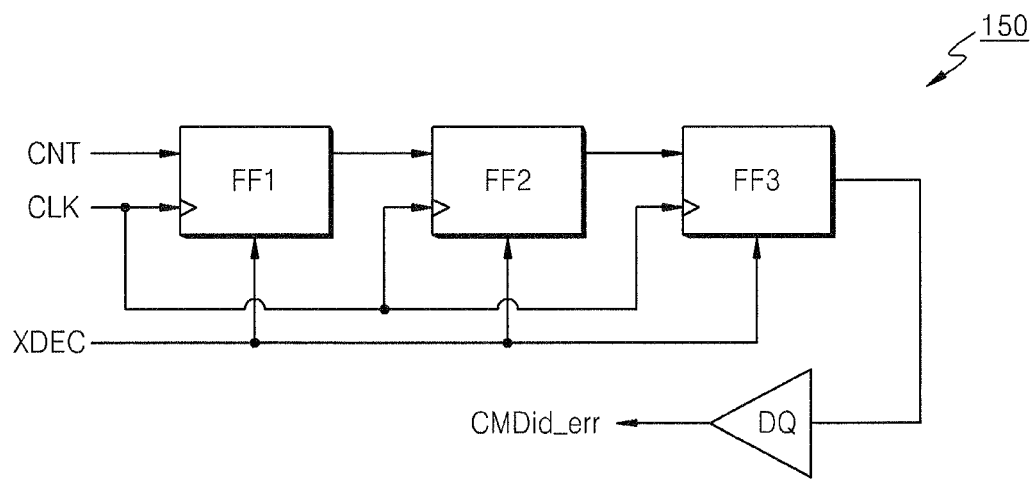
FIG. 8 illustrates a command identifier storage unit according to an embodiment of the inventive concept.

FIG. 8 illustrates the command identifier storage unit 150 that is formed as a register of the semiconductor memory device ME of the semiconductor memory system 100 of FIG. 1 in detail.

Referring to FIGS. 1 and 8, the command identifier storage unit 150 of the semiconductor memory device ME may include a plurality of flip flops FF1, FF2, and FF3. The number of flip flops may correspond to the amount of delay required from when the error detector 140 of FIG. 7 receives the data DTA to the time the error detection signal XDEC is output at the error detector 140. For example, when the time required for the error detector 140 of FIG. 7 to receive the data DTA and to output the error detection signal XDEC is three clock cycles, the command identifier storage unit 150 of the semiconductor memory device ME includes three stages of flip flops FF1, FF2, and FF3 to replicate the three clock cycle delay, as illustrated in FIG. 8.

Thus, the command identifier storage unit 150 includes the number of flip flops that corresponds to the number of clock cycles required for detecting an error, so as to store the command identifier CMDid, e.g., the count of number of clock pulses or commands already received, and outputting the command identifier CMDid_err regarding the command during which an error occurred.

Figure 9:
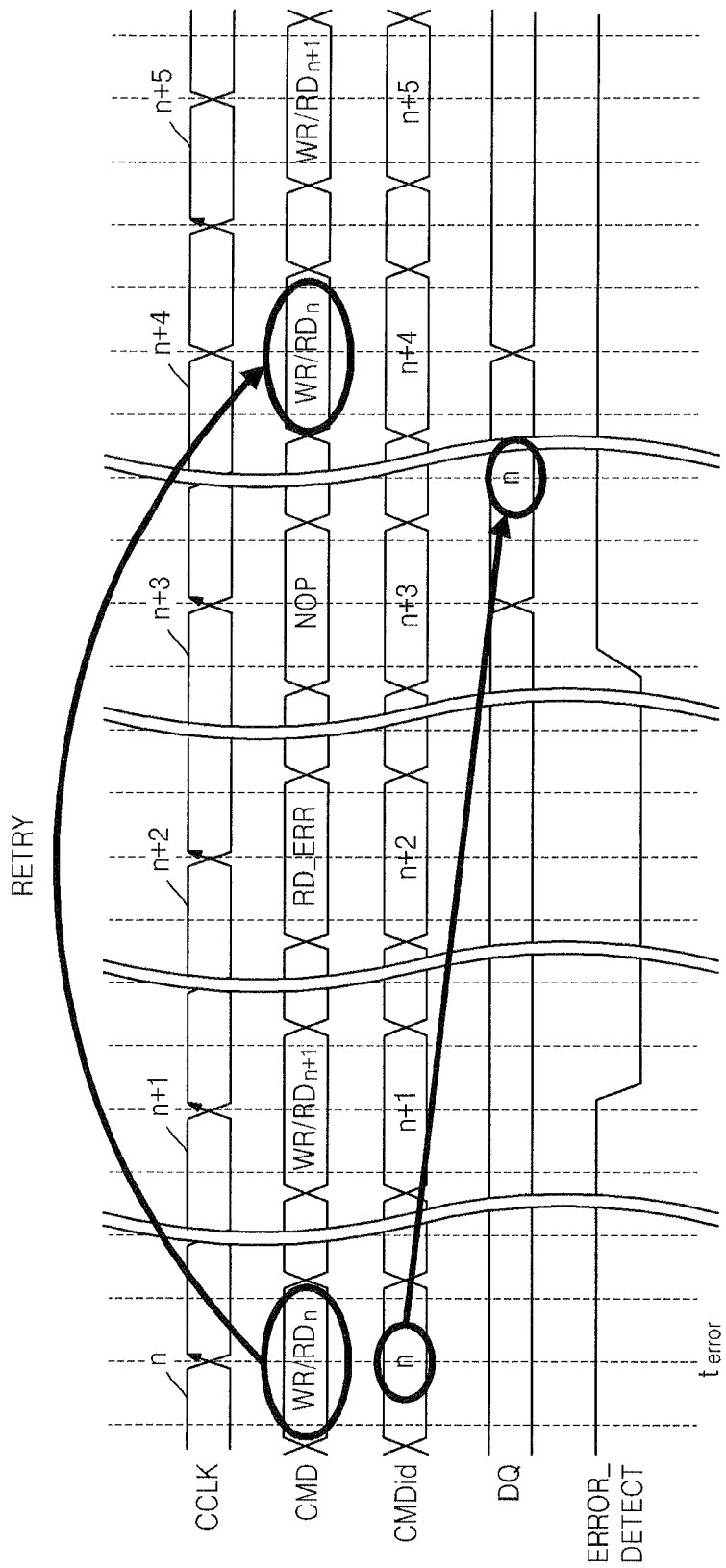
FIGS. 9 and 10 illustrate timing diagrams of signals involved in a command retransmission performed by the semiconductor memory system of FIG. 1.
Figure 10:
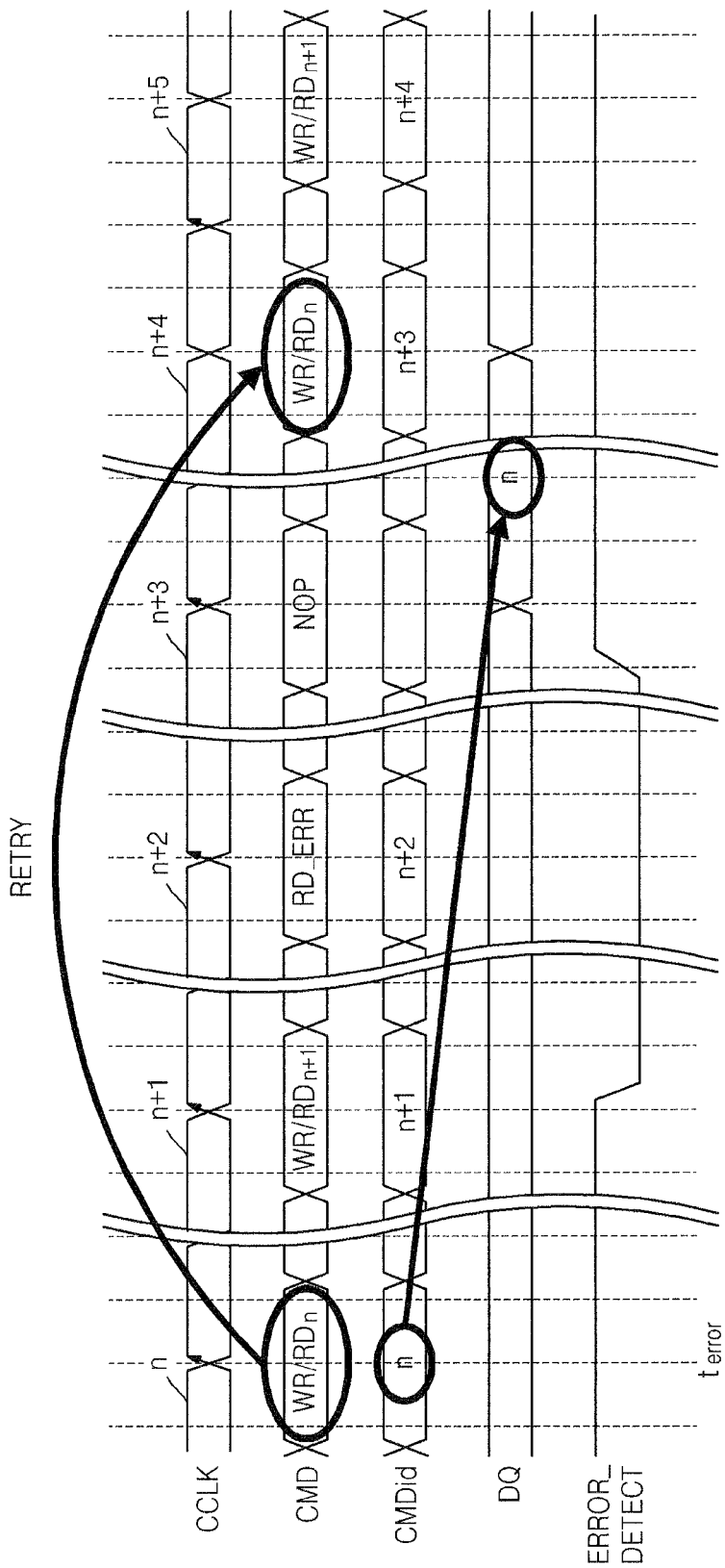

FIGS. 9 and 10 illustrate timing diagrams of signals involved in a command retransmission performed by the semiconductor memory system of FIG. 1.

Referring to FIGS. 9 and 10, commands WR/RDn and WR/RDn+1 are transmitted to the semiconductor memory device ME from the memory controller CTL. At a time $t_{error}$ or when an error is detected, the semiconductor memory device ME transmits a signal ERROR_DETECT that indicates there was an error detected, apart from the CMDid_err signal also transmitted to the memory controller CTL. As shown in FIG. 9, the signal ERROR_DETECT that indicates the occurrence of the error (logic low level) is output with a delay from a time when the error is detected at time $t_{error}$. Upon receipt of the ERROR_DETECT signal, the memory controller CTL issues commands that an error occurred (RD_ERR) and then a no operation command (NOP).

The command identifier storage unit 150 of the semiconductor memory device ME outputs a command identifier CMDid_err="n", the clock cycle count during which the command "WR/RDn" was transmitted and an error occurred. The memory controller CTL recognizes from the CMDid_err=n that the error occurred during the transmission of the WR/RDn command and also recognizes the delay affecting the next issued command. The memory controller CTL proceeds to retransmit the command WR/RDn and the command WR/RDn+1 after the NOP. The commands WR/RDn corresponding to command n and WR/RDn+1 corresponding to command n+1 were previously stored in the register in the command generator 130 of the memory controller CTL to facilitate quick retrieval and retransmission to the memory device ME.

Referring to FIG. 10, the counters 110 and 120 increase the command identifier CMDid based on the number of commands CMD applied to the semiconductor memory device ME. Since no command is applied to the semiconductor memory device ME for a (NOP) during common clock count n+3, the command count does not reach (n+3) until the start of the retransmission command, or common clock count (n+4).

Figure 11:
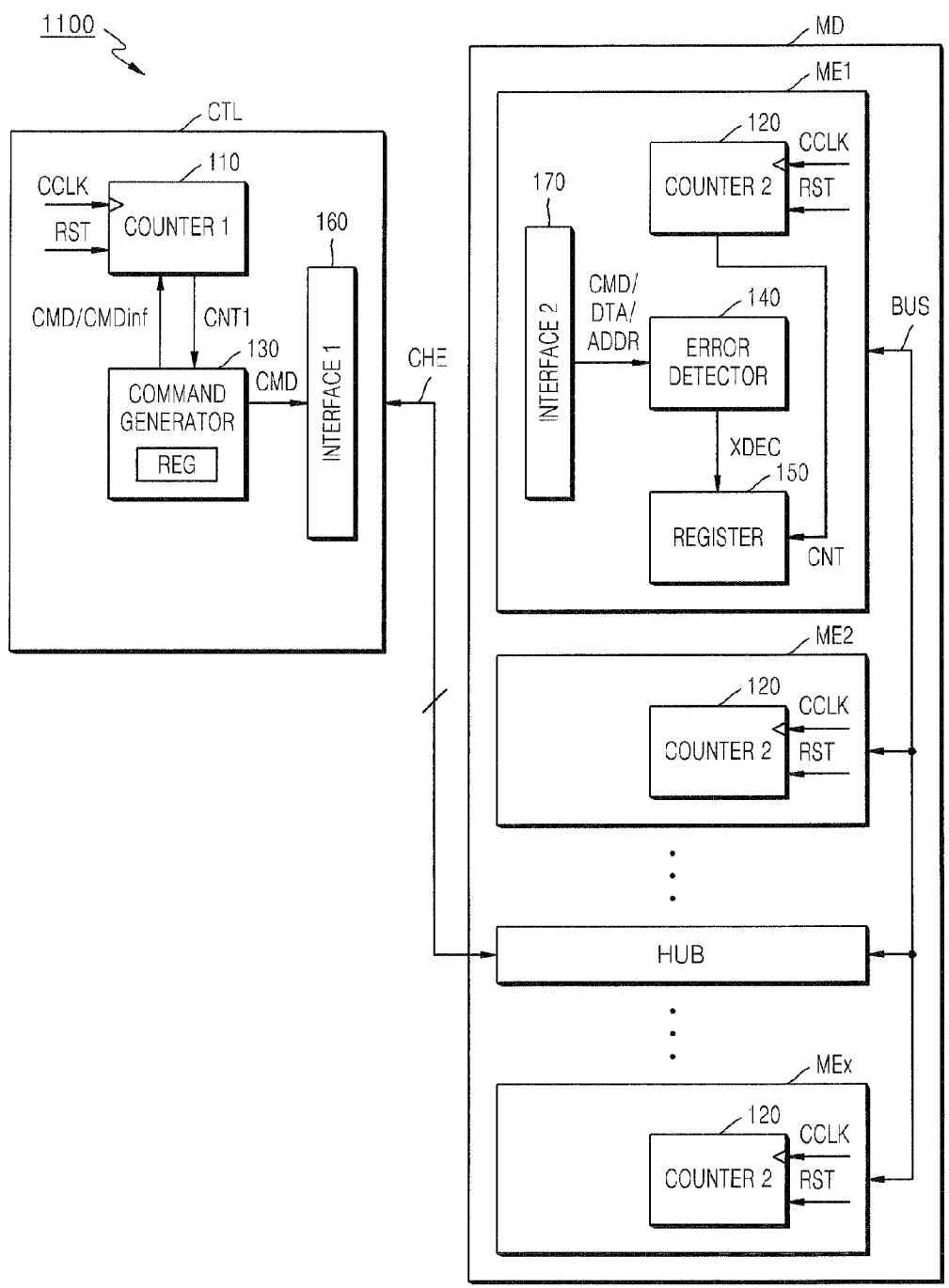
FIG. 11 illustrates a semiconductor memory system according to another embodiment of the inventive concept.

FIG. 11 illustrates a semiconductor memory system 1100 according to another embodiment of the inventive concept.

Referring to FIG. 11, the semiconductor memory system 1100 according to the current embodiment of the inventive concept includes the memory controller CTL of FIG. 1 and a memory module MD. The memory module MD includes a plurality of semiconductor memory devices ME1, ME2, ..., and MEx (where x is an integer that is equal to or greater than 3) and a hub HUB.

The hub HUB in the memory module MD is configured to coordinate communication between each of the plurality of semiconductor memory devices and the memory controller CTL in a known manner. The memory controller transmits the commands, data, and addresses to the hub HUB and the HUB relays the transmitted signals to the identified semiconductor memory device. The operations described above in connection with clock or command count, storage of corresponding data, command, and address in the register, and retransmission for FIGS. 1 to 10 are applicable for the semiconductor memory system 1100 of FIG. 11.

The semiconductor memory system 1100 of FIG. 11 illustrates one memory module MD. However, aspects of the inventive concept are not limited thereto and are applicable to a semiconductor memory system having a plurality of memory modules MD.

Figure 12:
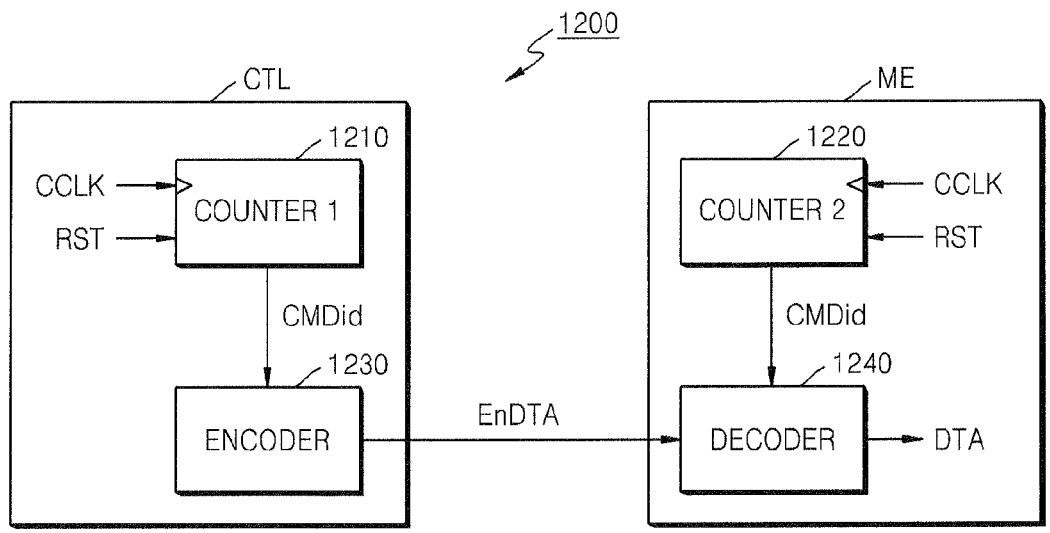
FIG. 12 illustrates a semiconductor memory system according to another embodiment of the inventive concept.

FIG. 12 illustrates a semiconductor memory system 1200 according to another embodiment of the inventive concept.

Referring to FIG. 12, the semiconductor memory system 1200 according to the current embodiment of the inventive concept includes a memory controller CTL including counters 1210 and 1220 that are respectively synchronized with a common clock signal CCLK and output command identifiers (counted values), and a semiconductor memory device ME, like in the semiconductor memory system 100 of FIG. 1. However, unlike in the semiconductor memory system 100 of FIG. 1, the semiconductor memory system 1200 of FIG. 12 may include an encoder 1230 and a decoder 1240, may check and correct an error by using a command identifier CMDid and may perform encoding and decoding by using the command identifier CMDid as an encoded code.

FIG. 12 illustrates that the memory controller CTL includes the encoder 1230 and that the semiconductor memory device ME includes the decoder 1240. However, aspects of the inventive concept are not limited thereto. For example, the memory controller CTL may include the decoder 1240, and the semiconductor memory device ME may include the encoder 1230, and each of the memory controller CTL and the semiconductor memory device ME may include the encoder 1230 and the decoder 1240, respectively.

Also, the encoder 1230 and the decoder 1240 of FIG. 12 may be added to the semiconductor memory system 100 of FIG. 1.

Figure 13:
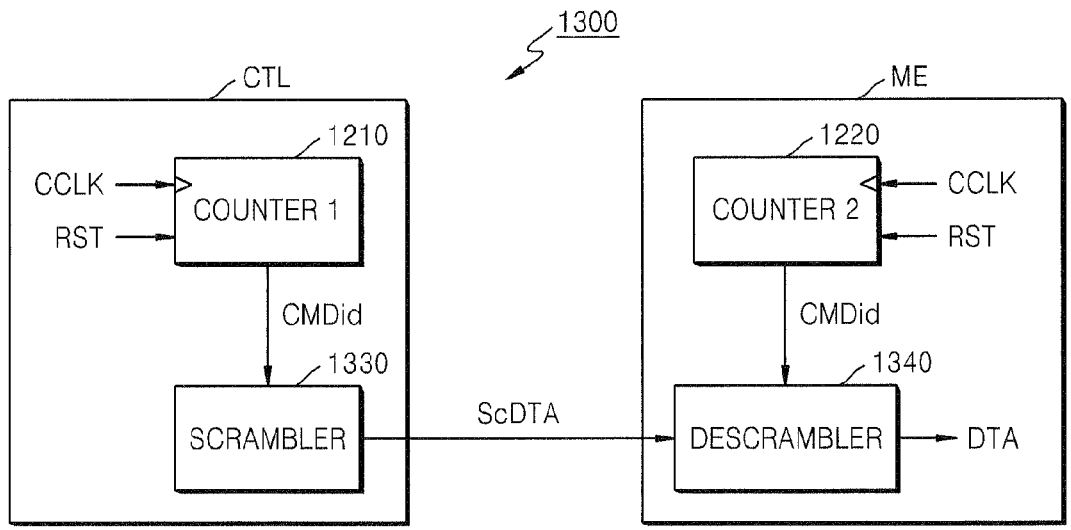
FIG. 13 illustrates a semiconductor memory system according to another embodiment of the inventive concept.

FIG. 13 illustrates a semiconductor memory system 1300 according to another embodiment of the inventive concept.

Referring to FIG. 13, the semiconductor memory system 1300 according to the current embodiment of the inventive concept includes a scrambler 1330 that performs scrambling by using a command identifier CMDid as a key or seed, and a descrambler 1340 that performs descrambling by using the command identifier CMDid as a key or seed. Even in the semiconductor memory system 1300 of FIG. 13, a memory controller CTL includes the scrambler 1330 and the semiconductor memory device ME includes the descrambler 1340. However, the memory controller CTL may include the descrambler 1340 and the semiconductor memory device ME may include the scrambler 1330. Alternatively, each of the memory controller CTL and the semiconductor memory device ME may include the scrambler 1330 and the descrambler 1340, respectively. Also, the scrambler 1330 and the descrambler 1340 of FIG. 13 may be added to the semiconductor memory system 100 of FIG. 1.

Thus, in the semiconductor memory systems 1100, 1200, and 1300 of FIGS. 11, 12, and 13, the command identifier CMDid is generated by using the counters 1210 and 1220 that are synchronized with each other and disposed in the memory controller CTL and the semiconductor memory device ME, and the command identifier CMDid is used as a key or seed for encoding/decoding or scrambling/descrambling so that electromagnetic interference (EMI) or intersymbol interference (ISI) of a signal transmitted to or received from the Memory controller CTL and the semiconductor memory device ME can be reduced and signal integrity (SI) can be improved.

Figure 14:
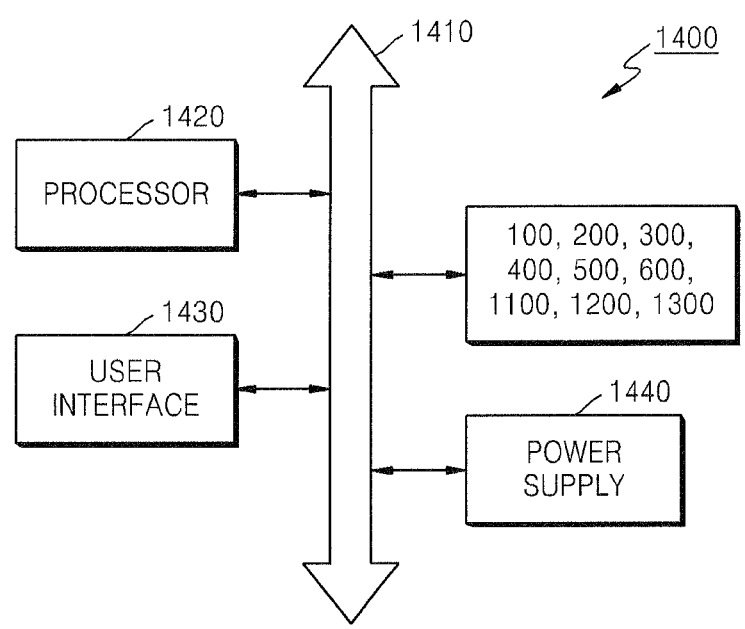
FIG. 14 illustrates a computer system including a semiconductor memory system, according to an embodiment of the inventive concept.

FIG. 14 illustrates a computer system 1400 including a semiconductor memory system, according to an embodiment of the inventive concept.

Referring to FIG. 14, the computer system 1400 according to the current embodiment of the inventive concept includes a processor 1420 electrically connected to a bus 1410, and semiconductor memory systems 100, 200, 300, 400, 500, 600, 1100, 1200, and 1300 illustrated in FIGS. 1, 2, 3, 4, 5, 6, 11, 12, and 13. The semiconductor memory systems 100, 200, 300, 400, 500, 600, 1100, 1200, and 1300 may include a memory controller and a semiconductor memory device. N-bit data processed/to be processed by the processor 1420 (where N is 1 or an integer greater than 1) may be stored in the semiconductor memory systems 100, 200, 300, 400, 500, 600, 1100, 1200, and 1300. The computer system 1400 of FIG. 14 may further include a user interface 1430 and a power supply 1440.

The computer system 1400 of FIG. 14 may be a mobile device, a battery for supplying an operating voltage of the computer system 1400 and a modem, such as a baseband chipset, may be additionally provided. Also, one ordinary skilled in the art can readily appreciate that the computer system 1400 of FIG. 14 may further include an application chipset, a camera image processor (CIS), a mobile DRAM, and the like.

For example, by using the command identifier CMDid described above, the semiconductor memory systems according to the embodiments of the inventive concept may perform various operations for increasing its operating efficiency, which will be described in more detail below.

FIGS. 15 through 19 illustrate various embodiments in which a command identifier is used in a semiconductor memory system according to an embodiment of the inventive concept.

Figure 15:
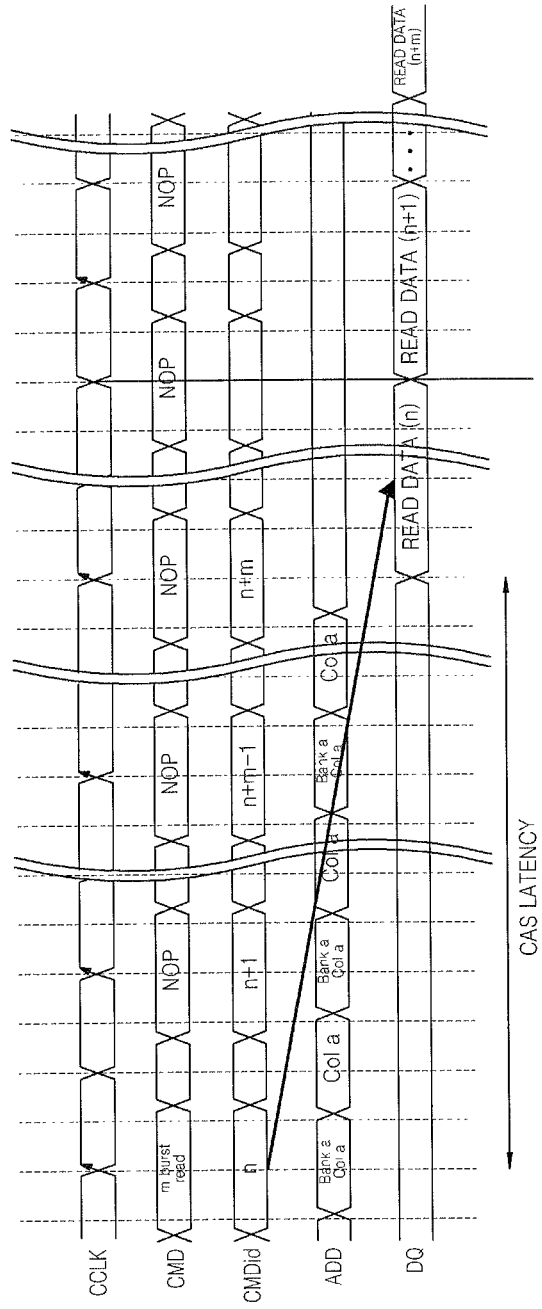
FIGS. 15 through 19 illustrate various embodiments in which a command identifier is used in a semiconductor memory system according to an embodiment of the inventive concept.

Referring to FIG. 15, a memory controller and a semiconductor memory device of the semiconductor memory system according to the current embodiment of the inventive concept may execute a plurality of predetermined commands by using the command identifier CMDid described above. For example, as illustrated in FIG. 15, when the memory controller applies an m-burst (where m is a natural number that is equal to or greater than 2) read command to the semiconductor memory device, the semiconductor memory device may repeatedly execute a read command m times (READ DATA (n), READ DATA(n+1), . . . , and READ DATA(n+m−1)). In this regard, the semiconductor memory device may be synchronized with the memory controller and may repeatedly execute the read command m times by using the command identifier CMDid. In detail, since the semiconductor memory device is synchronized with the memory controller by the command identifier CMDid, even when the memory controller transmits only one m-burst read command, the semiconductor memory device may execute m read commands accurately.

Figure 16:
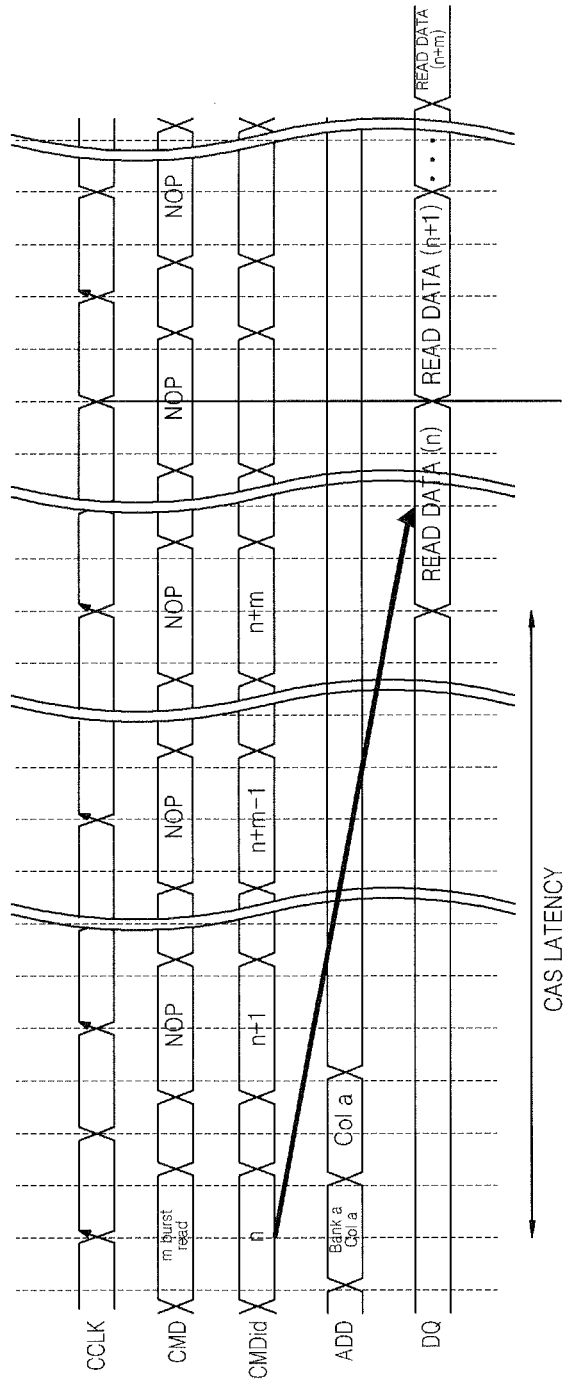

In FIG. 15, the m-burst read commands are transmitted to the semiconductor memory device from the memory controller only once, whereas an address ADD is transmitted to the semiconductor memory device from the memory controller every time. However, aspects of the inventive concept are not limited thereto. For example, as illustrated in FIG. 16, when data is read from an address ADD that is consecutively disposed in a memory cell array of a semiconductor memory device, the address ADD may also be transmitted only once, like in the m-burst read commands.

Figure 17:
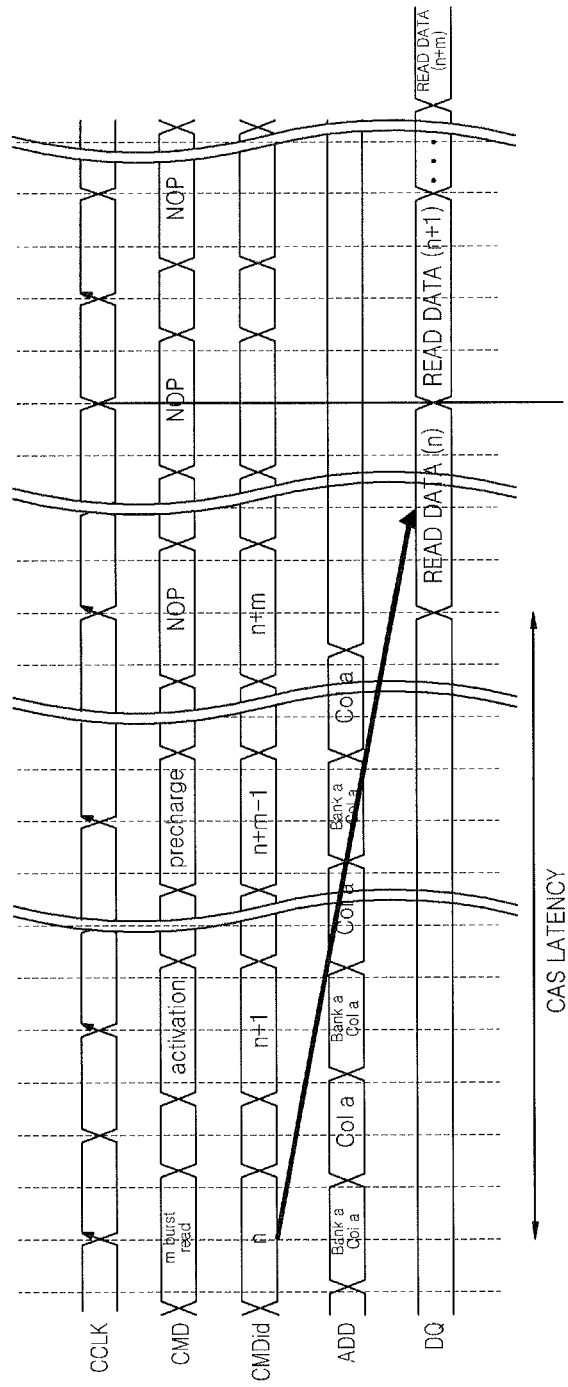

In FIG. 15, after the memory controller transmits the m-burst read commands to the semiconductor memory device, no operation is performed until the semiconductor memory device completes a read operation m times (NOP). However, aspects of the inventive concept are not limited thereto. For example, as illustrated in FIG. 17, after the memory controller transmits the m-burst read commands to the memory device, at an arbitrary time before the semiconductor memory device completes the read operation m times, the memory controller may transmit an activation command, a precharge command, or the like to the semiconductor memory device.

Figure 18:
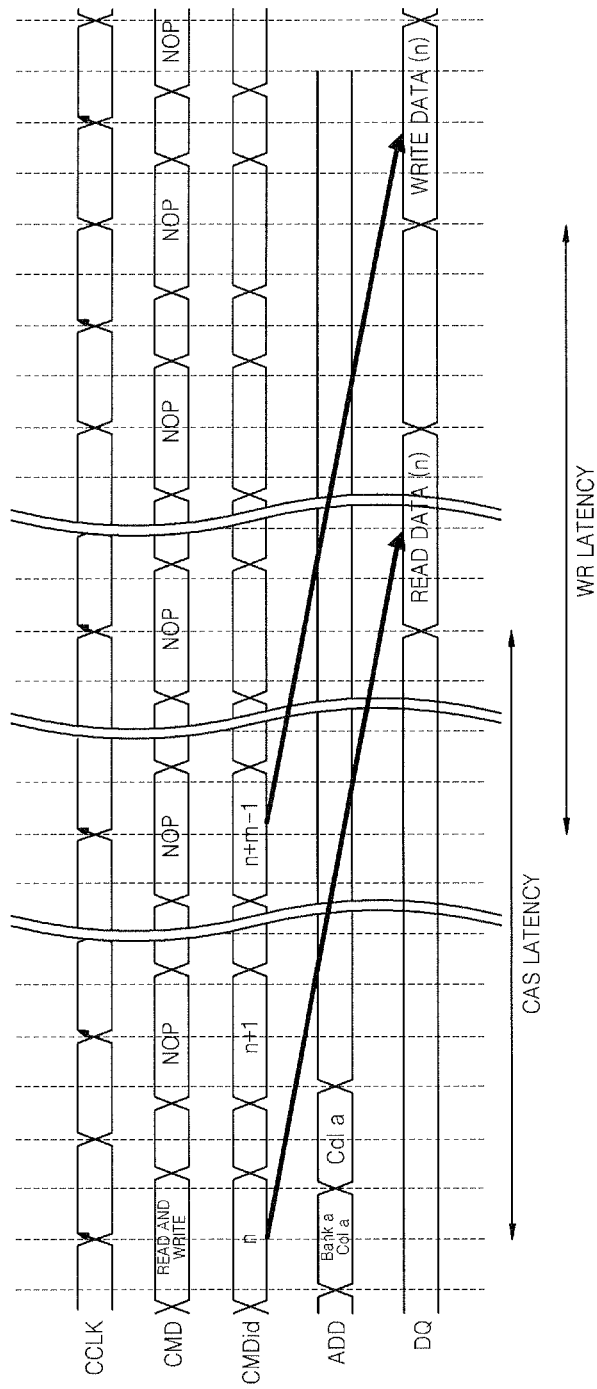

Also, as illustrated in FIG. 18, different commands may be transmitted as one command to the semiconductor memory device from the memory controller, wherein the semiconductor memory device may sequentially execute a plurality of commands in synchronization with the command identifier CMDid described above. In FIG. 18, in particular, when the command identifier CMDid is n, a read command READ and a write command WRITE are transmitted to the semiconductor memory device at one time, and after a CAS latency, the semiconductor memory device executes the read command READ (READ DATA(n)), and when the command identifier CMDid is (n+m−1), the write command WRITE is automatically executed (WRITE DATA(n)).

Thus, in the semiconductor memory system according to the current embodiment, a plurality of commands to be executed by the semiconductor memory device are transmitted as one command, and the plurality of commands are respectively executed in the semiconductor memory device based on a command identifier synchronized between the memory controller and the semiconductor memory device so that the utility of a channel for transmitting a command between the memory controller and the semiconductor memory device can be improved.

Figure 19:
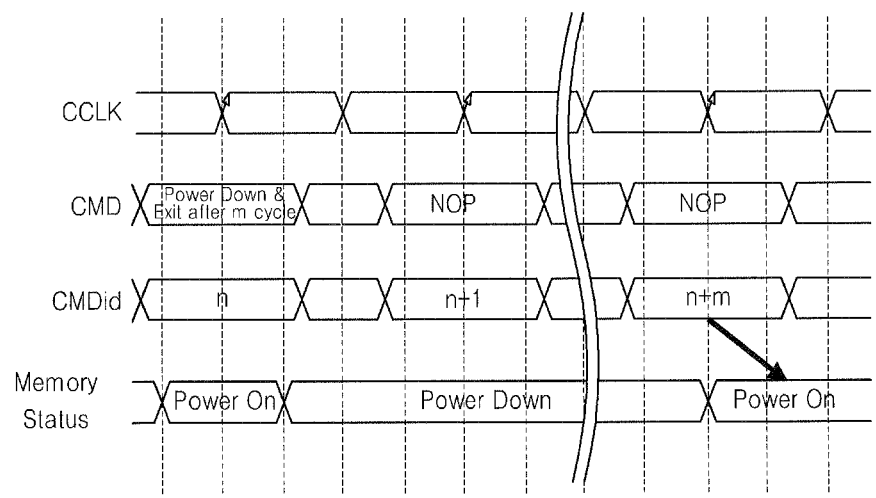

Furthermore, as illustrated in FIG. 19, in the semiconductor memory system according to the current embodiment, by using the command identifier CMDid, the semiconductor memory device may set a predetermined command at a predetermined time. In FIG. 19, in particular, a power-down command and a command that instructs to leave a power-down state after an m-cycle elapses is transmitted as one command to the semiconductor memory device when the command identifier CMDid is n. The semiconductor memory device that receives the power-down command and the command leaves the power-down state at a time when the m-cycle elapses (command identifier CMDid=n+m−1). Thus, in the semiconductor memory system according to the current embodiment, since the semiconductor memory device may be maintained in the power-down state until the predetermined command is executed at the predetermined time, power consumption of the semiconductor memory device can be reduced.

While the inventive concept has been particularly shown and described with reference to exemplary embodiments thereof, it will be understood that various changes in form and details may be made therein without departing from the spirit and scope of the following claims.

What is claimed is:

1. A memory system comprising:
A memory controller comprising:
a command generator configured to generate commands;
a first counter configured to count a first number of commands in response to a clock signal;
a first register configured to store the first number of commands counted; and
a first interface configured to interface with a memory device including transmitting the commands, the first number of commands counted, address, and transmitting and receiving data;
the memory device comprising:
a second interface configured to interface with the memory controller including receiving the commands, the first number of commands counted, the address and the data from the memory controller;
a second counter configured to count a second number of commands received in response to the clock signal; and
a second register configured to store the second number of commands received,
wherein the second interface is further configured to transmit the second number of commands received to the memory controller.

2. The memory system according to claim 1, the memory device further including an error detector configured to detect an occurrence of error in the commands, the address or the data received from the memory controller and to output an error detect signal, wherein the count number of the commands received stored in the second register is sent to the memory controller based on the error detect signal.

3. The memory system according to claim 1, further including a common clock generator configured to generate the clock signal.

4. The memory system according to claim 3, wherein the common clock generator is disposed in the memory controller.

5. The memory system according to claim 3, wherein the common clock generator is disposed in the memory device.

6. The memory system according to claim 3, wherein the common clock generator is disposed external to the memory controller and the memory device.

7. The memory system according to claim 1, wherein the first counter and the second counter are configured to reset using a common reset signal.

8. The memory system according to claim 7, wherein the common reset signal is based on a refresh command.

9. The memory system according to claim 1, wherein the memory controller is configured to store commands corresponding to the number of commands stored in the first register.

10. The memory system according to claim 1, wherein the memory device includes a DRAM.

11. A memory device comprising:
   an interface configured to interface with a memory controller including receiving commands, data, and address from the memory controller;
   a counter configured to count a number of commands received in response to a clock signal; and
   a register configured to store the number of commands received,
   wherein the interface is further configured to transmit the count number of the commands received to the memory controller.

12. The memory device of claim 11, wherein the clock signal is commonly used in the memory device and the memory controller to clock the commands.

13. The memory device of claim 11, further including an error detector configured to detect an occurrence of error in the commands, the address or the data received from the memory controller and to output an error detect signal, wherein number of commands received stored in the register is sent to the memory controller based on the error detect signal.

14. A memory device comprising:
   an interface configured to interface with a memory controller including receiving commands, data, and address from the memory controller;
   a counter configured to count a number of pulses of a clock signal; and
   a register configured to store the count number of pulses of the clock signal,
   wherein the interface is further configured to transmit the count number of the number of pulses of the clock signal to the memory controller.

15. The memory device of claim 14, further including a clock signal line carrying the clock signal is connected to the memory controller.

16. The memory device of claim 14, further including an error detector configured to detect an occurrence of error in the commands, the address or the data received from the memory controller and to output an error detect signal, wherein the count number of the pulses of the clock signal stored in the register is sent to the memory controller based on the error detect signal.

17. A memory system comprising:
   a memory controller comprising:
      a command generator configured to generate commands;
      a first counter configured to count a first number of commands in response to a clock signal;
      a first register configured to store the first number of commands counted;
      a first interface configured to interface with a hub to transmit the commands, the first number of commands, address, and to transmit and receive data; and
   a plurality of memory devices connected to the hub, each memory device comprising:
      a second interface configured to interface with the hub including receiving the commands, the first number of commands, and the data from the memory controller;
      a second counter configured to count a second number of commands received in response to the clock signal;
      a second register configured to store the second number of commands received,
      wherein the second interface is further configured to transmit the second number of commands received to the memory controller via the hub.

18. A method of memory control comprising:
   generating commands at a memory controller;
   counting a number of commands in response to a clock signal;
   storing the commands and the count numbers corresponding to the commands;
transmitting to a memory device the commands, the count number of the commands, and data;
   receiving at the memory device the commands, the count number of the commands, and data sent from the memory controller;
   counting at the memory device the number of commands received in response to the clock signal;
storing at the memory device the count number of commands received; and
   transmitting the count number of the commands received to the memory controller.

19. The method of claim 18, wherein said transmitting the count number of the command to the memory controller is performed upon indication of an error condition.

20. The method of claim 19, further including retransmitting from the memory controller to the memory device the command and data corresponding to the count number of the commands received from the memory device.

* * * * *